US012271028B2

United States Patent
Wang et al.

(10) Patent No.: US 12,271,028 B2
(45) Date of Patent: Apr. 8, 2025

(54) MONOLITHIC OPTOELECTRONIC INTEGRATED CIRCUIT AND METHOD FOR FORMING SAME

(71) Applicant: NANJING UNIVERSITY OF POSTS AND TELECOMMUNICATIONS, Nanjing (CN)

(72) Inventors: Yongjin Wang, Nanjing (CN); Jiabin Yan, Nanjing (CN); Jinlong Piao, Nanjing (CN)

(73) Assignee: NANJING UNIVERSITY OF POSTS AND TELECOMMUNICATIONS, Nanjing (CN)

( * ) Notice: Subject to any disclaimer, the term of this patent is extended or adjusted under 35 U.S.C. 154(b) by 258 days.

(21) Appl. No.: 17/853,757

(22) Filed: Jun. 29, 2022

(65) Prior Publication Data

US 2022/0334308 A1    Oct. 20, 2022

Related U.S. Application Data

(63) Continuation of application No. PCT/CN2020/128348, filed on Nov. 12, 2020.

(30) Foreign Application Priority Data

Feb. 25, 2020  (CN) .......................... 202010115714.2

(51) Int. Cl.
  *G02B 6/13*   (2006.01)
  *G02B 6/12*   (2006.01)
  (Continued)

(52) U.S. Cl.
  CPC ........... *G02B 6/12004* (2013.01); *G02B 6/13* (2013.01); *H10D 1/47* (2025.01); *H10D 30/015* (2025.01);
  (Continued)

(58) Field of Classification Search
  CPC .................................. G02B 6/13; H01L 28/20
  (Continued)

(56) References Cited

U.S. PATENT DOCUMENTS

| 5,936,266 A | * | 8/1999 | Holonyak, Jr. | ......... H01L 33/30 257/97 |
| 6,355,945 B1 | * | 3/2002 | Kadota | ................. H01L 27/153 257/190 |

(Continued)

FOREIGN PATENT DOCUMENTS

| CN | 103107179 A | 5/2013 |
| CN | 108231818 A | 6/2018 |

(Continued)

OTHER PUBLICATIONS

International Search Report of International Application No. PCT/CN2020/128348 dated Jan. 28, 2021 with English translation, (4p).

*Primary Examiner* — Kaveh C Kianni
(74) *Attorney, Agent, or Firm* — Arch & Lake LLP

(57) ABSTRACT

A monolithic optoelectronic integrated circuit is provided, including: a substrate including photonic integrated device region and a peripheral circuit region; a first GaN-based multi-quantum well optoelectronic PN-junction device including a first P-type ohmic contact electrode and a first N-type ohmic contact electrode; and a first GaN-based field-effect transistor, where the first GaN-based field-effect transistor includes a first gate dielectric layer disposed on the surface of the substrate and having a first recess, a first gate filled within the first recess, and a first source and a first drain that are disposed the opposite sides of the first gate, where the first source is electrically connected to the first P-type ohmic contact electrode, the first drain is configured to be electrically connected to a first potential.

7 Claims, 4 Drawing Sheets

(51) Int. Cl.
*H10D 1/47* (2025.01)
*H10D 30/01* (2025.01)
*H10D 30/47* (2025.01)
*H10D 62/85* (2025.01)
*H10F 55/255* (2025.01)
*H10F 71/00* (2025.01)
*H10F 77/12* (2025.01)
*H10F 77/124* (2025.01)
*H10F 77/14* (2025.01)
*H10H 20/01* (2025.01)
*H10H 20/812* (2025.01)
*H10H 20/825* (2025.01)

(52) U.S. Cl.
CPC ....... *H10D 30/475* (2025.01); *H10D 62/8503* (2025.01); *H10F 55/255* (2025.01); *H10F 71/1278* (2025.01); *H10F 77/1246* (2025.01); *H10F 77/146* (2025.01); *H10H 20/01335* (2025.01); *H10H 20/812* (2025.01); *H10H 20/825* (2025.01); *G02B 2006/12123* (2013.01)

(58) Field of Classification Search
USPC .......................................................... 385/14
See application file for complete search history.

(56) References Cited

U.S. PATENT DOCUMENTS

| | | | | |
|---|---|---|---|---|
| 6,458,614 B1* | 10/2002 | Nanishi | ............... | H01L 27/15 257/E27.128 |
| 6,690,845 B1* | 2/2004 | Yoshimura | ............ | G02B 6/124 257/E25.032 |
| 6,819,845 B2* | 11/2004 | Lee | ............... | H01L 29/127 385/5 |
| 6,879,615 B2* | 4/2005 | Henrichs | ............ | H01S 5/18341 372/100 |
| 6,885,686 B2* | 4/2005 | Botez | ............... | B82Y 20/00 372/102 |
| 6,961,499 B2* | 11/2005 | Lee | ............... | B82Y 10/00 385/5 |
| 7,005,669 B1* | 2/2006 | Lee | ............... | B82Y 20/00 257/17 |
| 7,010,183 B2* | 3/2006 | Estes | ............... | B82Y 20/00 385/37 |
| 7,020,372 B2* | 3/2006 | Lee | ............... | G02F 1/3556 257/E29.082 |
| 7,045,833 B2* | 5/2006 | Campbell | ............ | H01L 31/1852 438/50 |
| 7,106,917 B2* | 9/2006 | Painter | ............ | G02B 6/12007 385/27 |
| 7,376,169 B2* | 5/2008 | Henrichs | ............ | B82Y 20/00 372/99 |
| 7,751,655 B2* | 7/2010 | Fattal | ............... | B82Y 20/00 385/27 |
| 8,455,856 B1 | 6/2013 | Hersee | | |
| 9,661,698 B2 | 5/2017 | Huang et al. | | |
| 10,306,714 B2 | 5/2019 | Huang et al. | | |
| 2001/0020440 A1* | 9/2001 | Morita | ............ | H01L 21/02647 257/E21.127 |
| 2001/0038655 A1* | 11/2001 | Tanaka | ............ | B82Y 20/00 257/E21.09 |
| 2002/0048836 A1* | 4/2002 | Kano | ............ | H01L 21/02505 257/E21.127 |
| 2002/0081055 A1* | 6/2002 | Painter | ............ | G02B 6/3636 385/2 |
| 2003/0047752 A1* | 3/2003 | Campbell | ............ | H01L 31/1852 257/432 |
| 2003/0123829 A1* | 7/2003 | Taylor | ............ | H01S 5/18308 257/E29.25 |
| 2003/0160254 A1* | 8/2003 | Henrichs | ............ | H01S 5/18341 257/E33.069 |
| 2004/0105476 A1* | 6/2004 | Wasserbauer | ............ | H01S 5/026 372/50.22 |
| 2004/0126072 A1* | 7/2004 | Hoon Lee | ............ | G02B 6/1225 385/27 |
| 2005/0058415 A1* | 3/2005 | Lee | ............ | B82Y 20/00 257/E29.082 |
| 2005/0058416 A1* | 3/2005 | Hoon Lee | ............ | G02F 1/3515 257/E29.082 |
| 2005/0218414 A1* | 10/2005 | Ueda | ............ | H01L 21/02639 257/E21.127 |
| 2006/0043356 A1* | 3/2006 | Kimura | ............ | B82Y 20/00 257/E29.093 |
| 2006/0198404 A1* | 9/2006 | Henrichs | ............ | H01S 5/18391 372/100 |
| 2008/0205461 A1* | 8/2008 | Henrichs | ............ | H01S 5/18391 372/29.023 |
| 2015/0061526 A1* | 3/2015 | Huang | ............ | H05B 45/44 315/250 |
| 2017/0325303 A1 | 11/2017 | Huang et al. | | |

FOREIGN PATENT DOCUMENTS

| | | |
|---|---|---|
| CN | 108615754 A | 10/2018 |
| CN | 108615755 A | 10/2018 |
| CN | 111430401 A | 7/2020 |
| EP | 0682373 A1 | 11/1995 |

* cited by examiner

Provide a substrate and define a photonic integrated component region and a peripheral circuit region on a surface of the substrate

S61

Form a first GaN-based multi-quantum well optoelectronic PN-junction component in the photonic integrated component region on the surface of the substrate, where the first GaN-based multi-quantum well optoelectronic PN-junction component is configured to act as a light-emitting diode in the monolithic optoelectronic integrated circuit, and includes a first P-type ohmic contact electrode and a first N-type ohmic contact electrode

S62

Form a first GaN-based field-effect transistor in the peripheral circuit region on the surface of the substrate, where the first GaN-based field-effect transistor includes a first gate dielectric layer disposed on the surface of the substrate and having a first recess, a first gate filled in the first recess, and a first source and a first drain that are disposed on the opposite sides of the first gate

S63

Electrically connect the first source to the first P-type ohmic contact electrode, the first drain to a first potential, the first N-type ohmic contact electrode to a second potential which is lower than the first potential, and the first gate to a control port to control the light-emitting diode to be turned on or turned off

MONOLITHIC OPTOELECTRONIC INTEGRATED CIRCUIT AND METHOD FOR FORMING SAME

CROSS-REFERENCE TO RELATED APPLICATIONS

This application is a continuation application of PCT application No. PCT/CN2020/128348 filed on Nov. 12, 2020, which claims priority to Chinese Patent Application No. CN202010115714.2 filed on Feb. 25, 2020, the entire disclosures thereof are incorporated herein by reference for all purposes.

TECHNICAL FIELD

The present disclosure relates to the technical field of integrated optoelectronics, and in particular, relates to a monolithic optoelectronic integrated circuit and a method for forming the same.

BACKGROUND

Monolithic optoelectronic integration represents an important field of development for future communications and information technologies. Compared with to the traditional off-chip interconnection, a monolithic optoelectronic integrated circuit has the advantages of small area size, high reliability, less noise, high speed, strong anti-interference capabilities, and the like. With the advancement of material science and manufacturing techniques, it is possible to integrate optical, optoelectronic, and electronic elements on a monolithic substrate. However, the current monolithic optoelectronic integrated circuit has many insufficiencies in terms of electronic properties, manufacturing process, and structural complexity.

Therefore, how to improve the electronic properties of the monolithic optoelectronic integrated circuit, lower the manufacturing complexity of the monolithic optoelectronic integrated circuit, and simplify the structure of the monolithic optoelectronic integrated circuit are technical problems to be solved urgently.

SUMMARY

The present disclosure provides a monolithic optoelectronic integrated circuit and a method for forming the same, to improve the low-performance of conventional monolithic optoelectronic integrated circuits.

According to a first aspect of the present disclosure, a monolithic optoelectronic integrated circuit is provided. The monolithic optoelectronic integrated circuit includes:
- a substrate, including a photonic integrated device region and a peripheral circuit region;
- a first GaN-based multi-quantum well optoelectronic PN-junction device, disposed in the photonic integrated device region on a surface of the substrate, where the first GaN-based multi-quantum well optoelectronic PN-junction device acts as a light-emitting diode in the monolithic optoelectronic integrated circuit, and includes a first P-type ohmic contact electrode and a first N-type ohmic contact electrode; and
- a first GaN-based field-effect transistor, disposed in the peripheral circuit region on the surface of the substrate, where the first GaN-based field-effect transistor includes a first gate dielectric layer disposed on the surface of the substrate and having a first recess, the first gate filled within the first recess, and a first source and a first drain that are disposed on two opposite sides of the first gate;
- where the first source is electrically connected to the first P-type ohmic contact electrode, the first drain is configured to be electrically connected to a first potential, the first N-type ohmic contact electrode is configured to be electrically connected to a second potential lower than the first potential, and the first gate is electrically connected to a control port to control the light-emitting diode to be turned on or turned off.

According to a second aspect of the present disclosure. A method for forming the monolithic optoelectronic integrated circuit is provided. The method includes:
- providing a substrate, and defining a photonic integrated device region and a peripheral circuit region on a surface of the substrate;
- forming a first GaN-based multi-quantum well optoelectronic PN-junction device in the photonic integrated device region on the surface of the substrate, where the first GaN-based multi-quantum well optoelectronic PN-junction device acts as a light-emitting diode in the monolithic optoelectronic integrated circuit, and includes a first P-type ohmic contact electrode and a first N-type ohmic contact electrode;
- forming a first GaN-based field-effect transistor in the peripheral circuit region on the surface of the substrate, where the first GaN-based field-effect transistor includes a first gate dielectric layer disposed on the surface of the substrate and having a first recess, a first gate filled within the first recess, and a first source and a first drain that are disposed on two opposite sides of the first gate; and
- electrically connecting the first source to the first P-type ohmic contact electrode, the first drain to a first potential, the first N-type ohmic contact electrode to a second potential lower than the first potential, and the first gate to a control port to control the light-emitting diode to be turned on or turned off.

BRIEF DESCRIPTION OF THE DRAWINGS

FIG. 6 is a flowchart of a method for forming a monolithic optoelectronic integrated circuit according to a specific embodiment of the present disclosure.

DETAILED DESCRIPTION

Reference will now be described in detail to examples, which are illustrated in the accompanying drawings. The following description refers to the accompanying drawings in which the same numbers in different drawings represent the same or similar elements unless otherwise represented. The examples described following do not represent all examples consistent with the present disclosure. Instead, they are merely examples of devices and methods consistent with aspects of the disclosure as detailed in the appended claims.

Terms used in the present disclosure are merely for describing specific examples and are not intended to limit the present disclosure. The singular forms "one", "the", and "this" used in the present disclosure and the appended claims are also intended to include a multiple form, unless other meanings are clearly represented in the context. It should also be understood that the term "and/or" used in the present disclosure refers to any or all of possible combinations including one or more associated listed items.

Reference throughout this specification to "one embodiment," "an embodiment," "an example," "some embodiments," "some examples," or similar language means that a particular feature, structure, or characteristic described is included in at least one embodiment or example. Features, structures, elements, or characteristics described in connection with one or some embodiments are also applicable to other embodiments, unless expressly specified otherwise.

It should be understood that although terms "first", "second", "third", and the like are used in the present disclosure to describe various information, the information is not limited to the terms. These terms are merely used to differentiate information of a same type. For example, without departing from the scope of the present disclosure, first information is also referred to as second information, and similarly the second information is also referred to as the first information. Depending on the context, for example, the term "if" used herein may be explained as "when" or "while", or "in response to . . . , it is determined that".

Hereinafter, specific embodiments of a monolithic optoelectronic integrated circuit and a method for forming the monolithic optoelectronic integrated circuit according to the present disclosure are described in detail with reference to the accompanying drawings.

Figure 1:
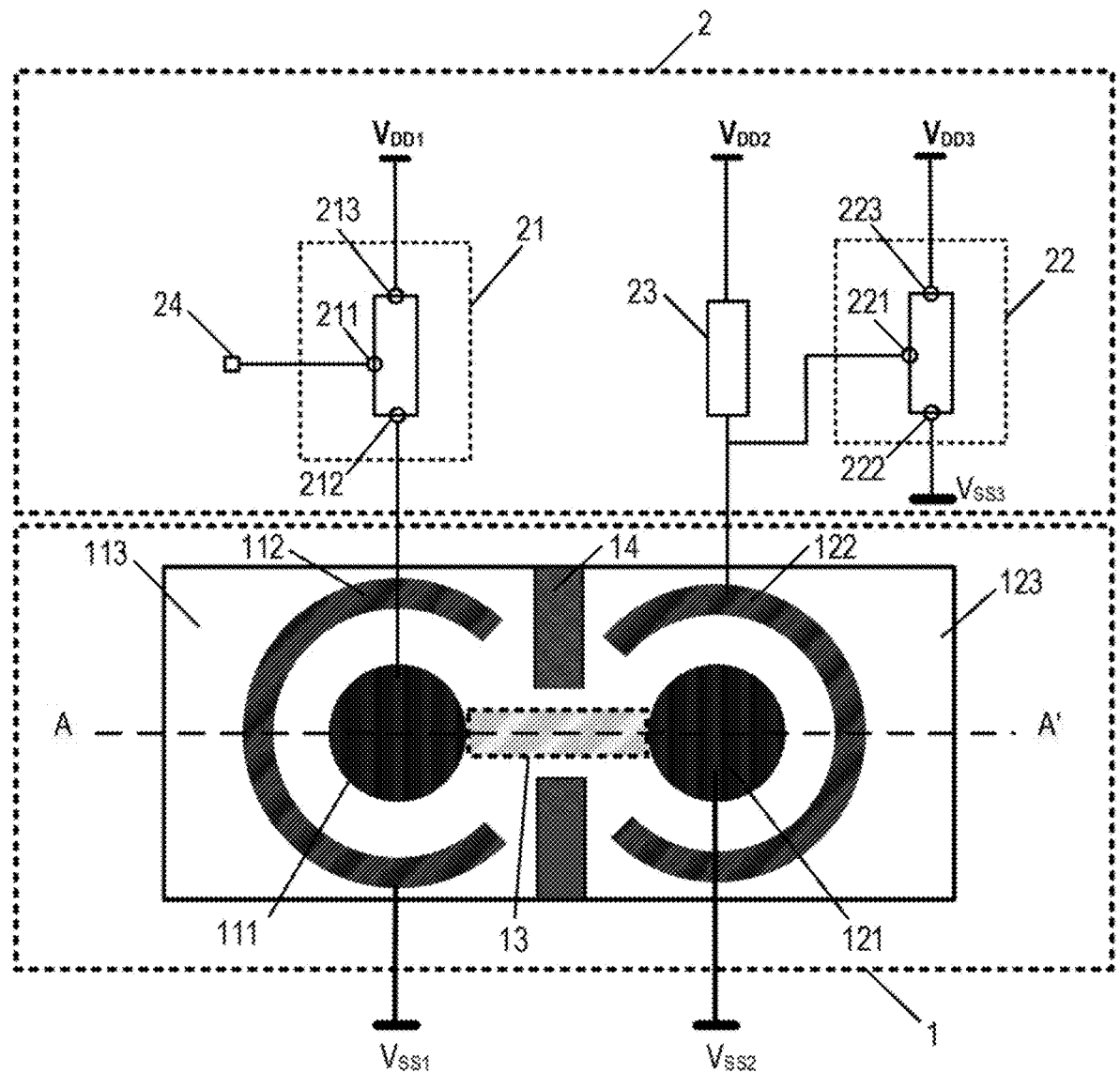
FIG. 1 is a schematic overall structural view of a monolithic optoelectronic integrated circuit according to a specific embodiment of the present disclosure.
Figure 2:
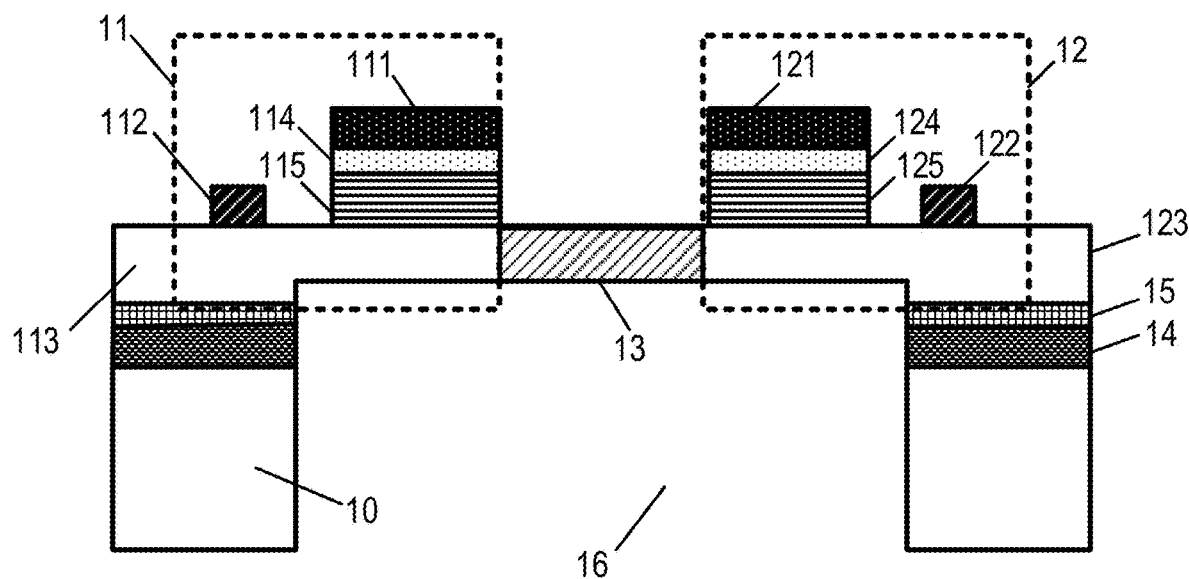
FIG. 2 is a schematic sectional view taken along an A-A' line in FIG. 1.
Figure 3:
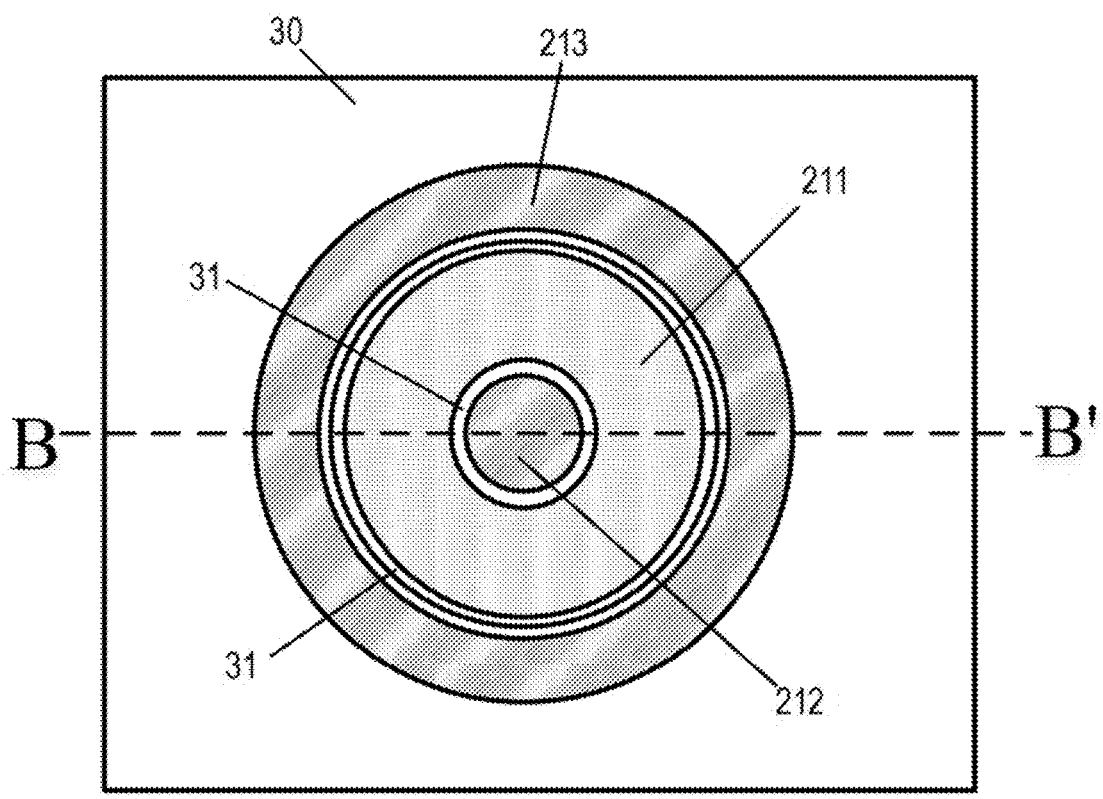
FIG. 3 is a schematic structural view of a first GaN-based field-effect transistor according to a specific embodiment of the present disclosure.
Figure 4:
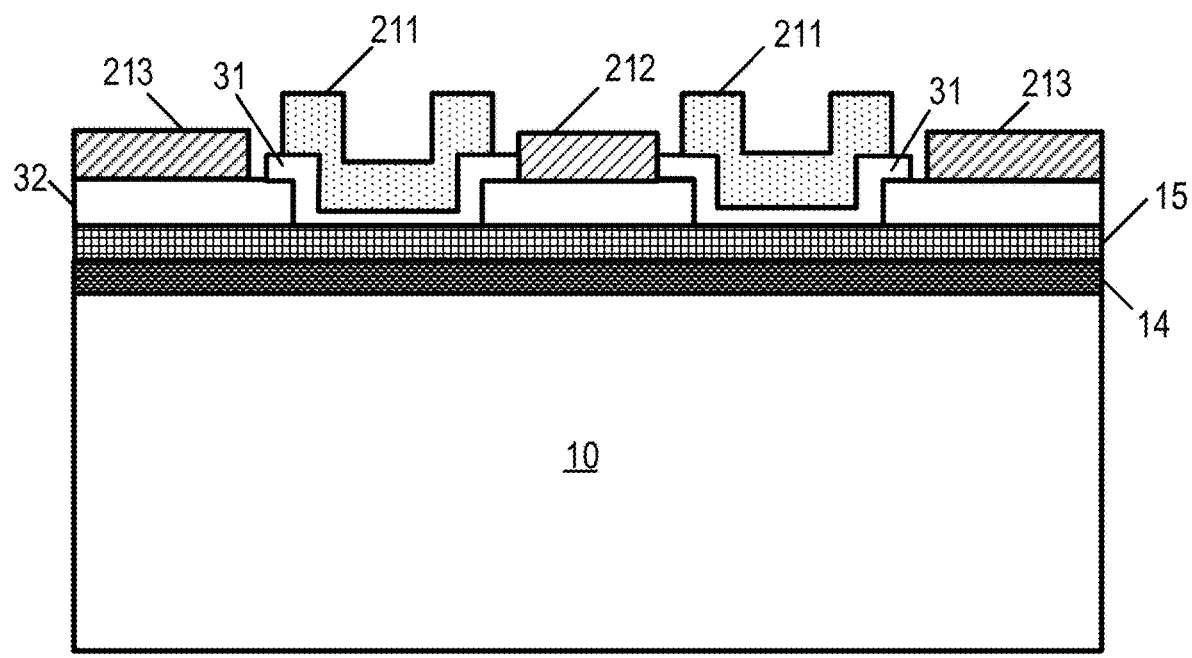
FIG. 4 is a schematic sectional view taken along a B-B' line in FIG. 3.

Some specific embodiments of the present disclosure provide a monolithic optoelectronic integrated circuit. FIG. 1 is a schematic overall structural view of a monolithic optoelectronic integrated circuit according to a specific embodiment of the present disclosure. FIG. 2 is a schematic sectional view taken along an A-A' line in FIG. 1. FIG. 3 is a schematic structural view of a first GaN-based field-effect transistor according to a specific embodiment of the present disclosure. FIG. 4 is a schematic sectional view taken along a B-B' line in FIG. 3. As illustrated in FIG. 1 to FIG. 4, the monolithic optoelectronic integrated circuit according to the specific embodiment includes:
  a substrate 10, including a photonic integrated device region 1 and a peripheral circuit region 2;
  a first GaN-based multi-quantum well optoelectronic PN-junction device 11, disposed in the photonic integrated device region 1 on a surface of the substrate 10, wherein the first GaN-based multi-quantum well optoelectronic PN-junction device 11 is configured to act as a light-emitting diode in the monolithic optoelectronic integrated circuit, and includes a first P-type ohmic contact electrode 111 and a first N-type ohmic contact electrode 112; and
  a first GaN-based field-effect transistor 21, disposed in the peripheral circuit region 2 on the surface of the substrate 10, wherein the first GaN-based field-effect transistor 21 includes a first gate dielectric layer 31 disposed on the surface of the substrate 10 and having a first recess, a first gate 211 filled within the first recess, and a first source 212 and a first drain 213 that are disposed on the opposite sides of the first gate 211;

wherein the first source 212 is electrically connected to the first P-type ohmic contact electrode 111, the first drain 213 is configured to be electrically connected to a first potential $V_{DD1}$, the first N-type ohmic contact electrode 112 is configured to be electrically connected to a second potential which is lower $V_{SS1}$ than the first potential $V_{DD1}$, and the first gate 211 is electrically connected to a control port 24 to control the light-emitting diode to be turned on or turned off.

To be specific, the substrate 10 may be a silicon substrate or a sapphire substrate. The first GaN-based multi-quantum well optoelectronic PN-junction device and the first GaN-based field-effect transistor 21 are both epitaxially grown on the surface of the substrate 10. The first GaN-based multi-quantum well optoelectronic PN-junction device 11 acts as a light-emitting diode of the monolithic optoelectronic integrated circuit, and is configured to emit a visible light signal carrying multimedia information to the outside. The first source 212 is electrically connected to the first P-type ohmic contact electrode 111, the first drain 213 is configured to be electrically connected to a first potential $V_{DD1}$ (that is, a high potential), the first N-type ohmic contact electrode 112 is configured to be electrically connected to a second potential $V_{SS1}$ (that is, a low potential) lower than the first potential, and the first gate 211 is electrically connected to a control port 24 to control the light-emitting diode to be turned on or turned off. The first gate 211 in the first GaN-based field-effect transistor 21 and the first P-type ohmic contact electrode 111 may be made of the same material, for example, Ni and/or Au. The first source 212 and the first drain 213 may be made of the same material as that of the first N-type ohmic contact electrode 112, for example, Ti and/or Al.

Alternatively, the monolithic optoelectronic integrated circuit further includes:
  a second GaN-based multi-quantum well optoelectronic PN-junction device 12, disposed in the photonic integrated device region 1 on the surface of the substrate 10, wherein the second GaN-based multi-quantum well optoelectronic PN-junction device 12 is configured to act as a photodetector in the monolithic optoelectronic integrated circuit, includes a second P-type ohmic contact electrode 121 and a second N-type ohmic contact electrode 122, and is connected to the first GaN-based multi-quantum well optoelectronic PN-junction device 11 by an optical waveguide 13;
  a resistor 23, disposed in the peripheral circuit region 2 on the surface of the substrate 10; and
  a second GaN-based field-effect transistor 22, disposed in the peripheral circuit region 2 on the surface of the substrate 10, wherein the second GaN-based field-effect transistor 22 includes a second gate dielectric layer disposed on the surface of the substrate and having a second recess, a second gate 221 filled in the second recess, and a second source 222 and a second drain 223 that are disposed on the opposite sides of the second gate 221;
  wherein one terminal of the resistor 23 is electrically connected to the second N-type ohmic contact electrode 122 and the other terminal of the resistor 23 is configured to be electrically connected to a third potential $V_{DD2}$, the second P-type ohmic contact electrode 121 is configured to be electrically connected to a fourth potential $V_{SS2}$ which is lower than the third potential $V_{DD2}$, and a potential between the second N-type ohmic contact electrode 122 and the resistor 23 is electrically connected to the second gate 221 to control the second GaN-based field-effect transistor 22 to be turned on or turned off.

To be specific, the second GaN-based multi-quantum well optoelectronic PN-junction device 12 is configured to act as a photodetector in the monolithic optoelectronic integrated circuit, such that the first GaN-based multi-quantum well optoelectronic PN-junction device 11 is optically connected to the second GaN-based multi-quantum well optoelectronic PN-junction device 12 by the optical waveguide 13, thereby implementing visible light communication. One terminal of the resistor 23 is electrically connected to the second N-type ohmic contact electrode 122 and the other terminal of the resistor 23 is connected to a third potential $V_{DD2}$ (that is, a high potential), and the second P-type ohmic contact electrode 121 is connected to a fourth potential $V_{SS2}$ (that is a low potential). A potential between the second N-type ohmic contact electrode 122 and the resistor 23 is electrically connected to the second gate 221, to control the second GaN-based field-effect transistor to be turned on or turned off, so as to further implement output of signals. The second drain 223 is connected to a fifth potential $V_{DD3}$ (that is, a high potential), the second source 222 is connected to a sixth potential $V_{SS3}$ (that is a low potential) lower than the fifth potential $V_{DD3}$.

Alternatively, the surface of the substrate 10 further includes an AlGaN buffer layer 14, and an undoped GaN layer 15 disposed on a surface of the AlGaN buffer layer 14; and the monolithic optoelectronic integrated circuit further includes a cavity 16 extending through the AlGaN buffer layer 14 and the undoped GaN layer 15 from the substrate 10, the optical waveguide 13 is a GaN clamped beam suspended above the cavity 16, the first GaN-based multi-quantum well optoelectronic PN-junction device 11 and the second GaN-based multi-quantum well optoelectronic PN-junction device 12 are formed on a surface of the undoped GaN layer 15 and suspended above the cavity 16.

Alternatively, the first GaN-based multi-quantum well optoelectronic PN-junction device 11 further includes a first N-type GaN epitaxial layer 113, a first InGaN/GaN multi-quantum well layer 115 and a first P-type GaN epitaxial layer 114 that are successively laminated along a direction perpendicular to the substrate 10, and the second GaN-based multi-quantum well optoelectronic PN-junction device 12 further includes a second N-type GaN epitaxial layer 123, a second InGaN/GaN multi-quantum well layer 125 and a second P-type GaN epitaxial layer 124 that are successively laminated along the direction perpendicular to the substrate 10; and the peripheral circuit region 2 further includes a third N-type GaN epitaxial layer 32 disposed on the surface of the undoped GaN layer 15, and the first source 212, the first drain 213, the second source 222 and the second drain 223 are all disposed on a surface of the third N-type GaN epitaxial layer 32;

wherein the third N-type GaN epitaxial layer 32 is provided with a first through hole and a second through hole that expose the undoped GaN layer 15, the first gate dielectric layer 31 covers an inner wall of the first through hole and a portion of the surface of the third N-type GaN epitaxial layer 32, and the second gate dielectric layer covers an inner wall of the second through hole and a portion of the surface of the third N-type GaN epitaxial layer 32.

To be specific, the first GaN-based multi-quantum well optoelectronic PN-junction device 11 and the second GaN-based multi-quantum well optoelectronic PN junction device 12 are symmetrically disposed. That is, the first GaN-based multi-quantum well optoelectronic PN-junction device 11 and the second GaN-based multi-quantum well optoelectronic PN-junction device 12 have the same structure, such that the first GaN-based multi-quantum well optoelectronic PN-junction device 11 and the second GaN-based multi-quantum well optoelectronic PN-junction device 12 may be synchronously formed. The cavity 16 successively extends through the substrate 10, the AlGaN buffer layer 14 and the undoped GaN layer 15 from a bottom surface of the substrate 10, such that the first GaN-based multi-quantum well optoelectronic PN-junction device 11, the second GaN-based multi-quantum well optoelectronic PN-junction device 12 and the optical waveguide 13 are all suspended above the cavity 16. A work function of the first P-type ohmic contact electrode 111 is greater than that of the first P-type GaN epitaxial layer 114, and a work function of the second P-type ohmic contact electrode 121 is greater than that of the second P-type epitaxial layer 124, such that a hole accumulation layer is formed on each side of a semiconductor. A work function of the first N-type ohmic contact electrode 112 is less than that of the first N-type GaN epitaxial layer 113, and a work function of the second N-type ohmic contact electrode 122 is less than that of the second N-type GaN epitaxial layer 124, such that an electron accumulation layer is formed on each side of the semiconductor.

The first GaN-based field-effect transistor 21 and the second GaN-based field-effect transistor 22 may have the same structure. Hereinafter, description is given using the first GaN-based field-effect transistor 21 as an example. The first gate 211 is disposed between the first source 212 and the first drain 213. The third N-type GaN epitaxial layer 32 in the peripheral circuit region 2 is provided with a first through hole that exposes the undoped GaN layer 15, and a dielectric material totally covers a side wall and a bottom wall of the first through hole such that the first gate dielectric layer 31 having a recess structure is formed. In this way, the first gate 211 is insulated from a GaN material therebelow, and a current-carrying sub-channel is controlled by a voltage applied to the gate 211. The first GaN-based field-effect transistor 21 according to this specific embodiment may employ one of wrap gate, common source or common drain or a combination of two or more thereof, to further improve an output performance of the first GaN-based field-effect transistor, and further reduce a size of the device. The third N-type GaN epitaxial layer 32 may be synchronously formed with the first N-type GaN epitaxial layer 113 and the second N-type GaN epitaxial layer 123, to further simplify the manufacturing process and manufacturing cost of the monolithic optoelectronic integrated circuit.

For avoidance of mutual interference between the manufacturing process and the electrical properties, alternatively, the monolithic optoelectronic integrated circuit further includes:

an isolation recess extending through the undoped GaN layer 15 and the AlGaN buffer layer 14 and exposing the substrate, wherein the isolation recess is configured to isolate the photonic integrated device region 1 from the peripheral circuit region 2.

Alternatively, along a direction parallel to the substrate 10, the first P-type ohmic contact electrode 111 has a circular cross section, and the first N-type ohmic contact electrode 112 has an arc-shaped cross section and is disposed as surrounding an outer circumference of the first P-type ohmic contact electrode 111; and along the direction parallel to the substrate 10, the second P-type ohmic contact electrode 121 has a circular cross section, and the second N-type ohmic contact electrode 122 has an arc-shaped cross section and is disposed as surrounding an outer circumference of the second P-type ohmic contact electrode 121.

To be specific, the first P-type ohmic contact electrode 111 and the second P-type ohmic contact electrode 121 may have the same structure, and the first N-type ohmic contact electrode 112 and the second N-type ohmic contact electrode 122 may have the same structure. Using the first P-type ohmic contact electrode 111 and the first N-type ohmic contact electrode 112 as examples, the first P-type ohmic contact electrode 111 has a circular cross section, and the first N-type ohmic contact electrode 112 has an open-annular cross section and is disposed as surrounding the first P-type ohmic contact electrode 111.

Figure 5:
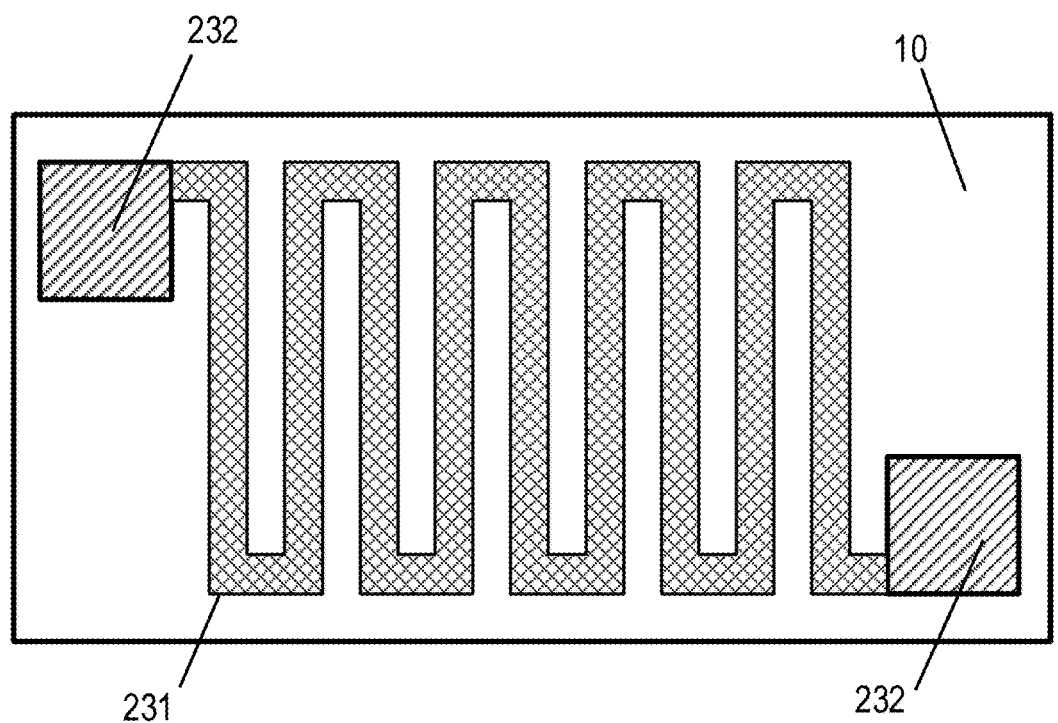
FIG. 5 is a schematic structural view of a resistor according to a specific embodiment of the present disclosure.

The resistor 23 may be an N-type GaN thin-film resistor, or may be an active resistor of the second GaN-based field-effect transistor 22, which may be selected by a person skilled in the art according to actual needs. FIG. 5 is a schematic structural view of a resistor according to a specific embodiment of the present disclosure. Alternatively, as illustrated in FIG. 5, the resistor 23 includes:

two resistive electrodes 232, disposed on the surface of the substrate 10; and a resistive arm 231, disposed on the surface of the substrate 10, wherein two terminals of the resistive arm 231 are respectively electrically connected to the two resistive electrodes 232.

To be specific, as illustrated in FIG. 5, the resistor 23 may be an N-type GaN thin-film resistor, and includes the resistive arm 231 that is in a flat and bending state, and the resistive electrode 232 connected to an end portion of the resistive arm.

In addition, some specific embodiments of the present disclosure further provide a method for forming the monolithic optoelectronic integrated circuit. FIG. 6 is a flowchart of a method for forming a monolithic optoelectronic integrated circuit according to a specific embodiment of the present disclosure. The structure of the monolithic optoelectronic integrated circuit formed according to this specific embodiment may be illustrated in FIG. 1 to FIG. 5. As illustrated in FIG. 1 to FIG. 6, the method for forming the monolithic optoelectronic integrated circuit according to the specific embodiments includes:

step S61: providing a substrate 10, and defining a photonic integrated device region 1 and a peripheral circuit region 2 on a surface of the substrate 10;

step S62: forming a first GaN-based multi-quantum well optoelectronic PN-junction device 11 in the photonic integrated device region 1 on the surface of the substrate 10, wherein the first GaN-based multi-quantum well optoelectronic PN-junction device 11 is configured to act as a light-emitting diode in the monolithic optoelectronic integrated circuit, and includes a first P-type ohmic contact electrode 111 and a first N-type ohmic contact electrode 112;

step S63: forming a first GaN-based field-effect transistor 21 in the peripheral circuit region 2 on the surface of the substrate 10, wherein the first GaN-based field-effect transistor 21 includes a first gate dielectric layer 31 disposed on the surface of the substrate 10 and having a first recess, a first gate 211 filled in the first recess, and a first source 212 and a first drain 213 that are disposed on the opposite sides of the first gate 211; and step S64: electrically connecting the first source 212 to the first P-type ohmic contact electrode 111, the first drain 213 to a first potential $V_{DD1}$, the first N-type ohmic contact electrode 112 to a second potential $V_{SS1}$ which is lower than the first potential $V_{DD1}$, and the first gate 221 to a control port 24 to control the light-emitting diode to be turned on or turned off.

Alternatively, the method further includes:

forming a second GaN-based multi-quantum well optoelectronic PN-junction device 12 in the photonic integrated device region on the surface of the substrate 10, wherein the second GaN-based multi-quantum well optoelectronic PN-junction device 12 is configured to act as a photodetector in the monolithic optoelectronic integrated circuit, and includes a second P-type ohmic contact electrode 121 and a second N-type ohmic contact electrode 122; and connecting the first GaN-based multi-quantum well optoelectronic PN-junction device 11 to the second GaN-based multi-quantum well optoelectronic PN junction device 12 by an optical waveguide 13;

forming a second GaN-based field-effect transistor 22 in the peripheral circuit region 2 on the surface of the substrate 10, wherein the second GaN-based field-effect transistor 22 includes a second gate dielectric layer disposed on the surface of the substrate 10 and having a second recess, a second gate 221 filled in the second recess, and a second source 222 and a second drain 223 that are disposed the opposite sides of the second gate 221;

forming a resistor 23 in the peripheral circuit region 2 on the surface of the substrate 10; and electrically connecting one terminal of the resistor 23 to the second N-type ohmic contact electrode 122 and the other terminal of the resistor 23 to a third potential $V_{DD2}$, the second P-type ohmic contact electrode 121 to a fourth potential $V_{SS2}$ which is lower than the third potential $V_{DD2}$, and a potential between the second N-type ohmic contact electrode 122 and the resistor 23 to the second gate 221 to control the second GaN-based field-effect transistor 22 to be turned on or turned off.

Alternatively, the method further includes:

forming an AlGaN buffer layer 14, and an undoped GaN layer 15 disposed on a surface of the AlGaN buffer layer 14 on the surface of the substrate 10;

forming an N-type GaN material layer by depositing an N-type GaN material on a surface of the undoped GaN layer 15;

etching the N-type GaN material layer, and forming a first N-type GaN epitaxial layer 113 of the first GaN-based multi-quantum well optoelectronic PN-junction device 11, a second N-type GaN epitaxial layer 123 of the second GaN-based multi-quantum well optoelectronic PN-junction device 12 and a third N-type GaN epitaxial layer 32 in the peripheral circuit region 2;

forming, by etching the third N-type GaN epitaxial layer 32, a first through hole and a second through hole that expose the undoped GaN layer 15; and forming a first gate dielectric layer 31 covering an inner wall of the first through hole and a portion of the surface of the third N-type GaN epitaxial layer 32, and forming a second gate dielectric layer covering an inner wall of the second through hole and a portion of the surface of the third N-type GaN epitaxial layer 32.

The method for forming the monolithic optoelectronic integrated circuit is described by examples hereinafter.

Referring to FIG. 1 to FIG. 5, the method for forming the monolithic optoelectronic integrated circuit specifically includes the following steps:

1. selecting a silicon-based or sapphire-based GaN epitaxial layer as a base, and forming, on the base, a substrate 10, and an AlGaN buffer layer 14, an undoped GaN layer 15, an N-type GaN material layer, an InGaN/GaN multi-quantum well material layer and a P-type GaN material layer that are successively laminated on a surface of the substrate 10 along a direction perpendicular to the substrate 10;
2. coating a first photoresist layer on a surface of the P-type GaN material layer and performing lithographic printing thereon, such that a first etching window is formed in the first photoresist layer, wherein the first etching window corresponds to a spacing region between a first GaN-based multi-quantum well optoelectronic PN-junction device 11 and a second GaN-based multi-quantum well optoelectronic PN-junction device 12 device; and dry etching, by inductively coupled plasma (ICP), to the N-type GaN material layer and removing the first photoresist layer.
3. coating a second photoresist layer on the surface of the P-type GaN material layer and performing lithographic printing thereon, such that a second etching window is formed in the second photoresist layer, drying etching, by the ICP, to the surface of the substrate 10 along the second etching window, forming an isolation groove configured to isolate a photonic integrated device region 1 from a peripheral circuit region 2, and removing the second photoresist layer and the InGaN/GaN multi-quantum well material layer and the P-type GaN material layer in the peripheral circuit region 2;
4. coating a third photoresist layer on a surface of the N-type GaN material layer in the peripheral circuit region 2 and performing lithographic printing thereon, such that a third etching window is formed in the third photoresist layer, etching the N-type GaN material layer to a surface of the undoped GaN layer 15 along the third etching window, forming a first through hole and a second through hole, and removing the third photoresist layer;
5. coating a fourth photoresist layer on the photonic integrated device region 1 and the peripheral circuit region 2, and performing lithographic printing thereon to remove the fourth photoresist layer for forming a first source region and a first drain region of a first GaN-based field-effect transistor, a second source region and a second drain region of a second-GaN-based field-effect transistor, a resistor region, a first N-type ohmic contact electrode region and a second N-type ohmic contact electrode region;
6. evaporating, by electron beams, an N-type ohmic contact metal, and removing the fourth photoresist layer to form a first source 212, a first drain 213, a second source 222, a second drain 223, a resistor 23, a first N-type ohmic contact electrode 112 and a second N-type ohmic contact electrode 122.
7. growing a high-quality first gate dielectric layer 31 on an inner wall of the first through hole, and growing a high-quality second gate dielectric layer on an inner wall of the second through hole by plasma enhanced chemical vapor deposition (PECVD) or atomic layer deposition;
8. coating a fifth photoresist layer on the photonic integrated device region 1 and the peripheral circuit region 2, and performing lithographic printing thereon to remove the fifth photoresist layer for forming a first gate region of the first-GaN-based field-effect transistor, a second gate region of the second GaN-based field-effect transistor, and surfaces of a first P-type ohmic contact electrode region and a second P-type ohmic contact electrode region.
9. evaporating, by electron beams, a P-type ohmic contact metal, and removing the fifth photoresist layer to form a first gate 211, a second gate 221, a first P-type ohmic contact electrode 111 and a second P-type ohmic contact electrode 121; and
10. removing the first GaN-based multi-quantum well optoelectronic PN-junction device 11, the second GaN-based multi-quantum well optoelectronic PN-junction device 12, and part of the substrate 10, the AlGaN buffer layer 14 and the undoped GaN layer 15 under an optical waveguide 13 to form a cavity 16.

devicedevicedevice In the monolithic optoelectronic integrated circuit and the method for forming the same according to the present disclosure, for one aspect, the first GaN-based multi-quantum well optoelectronic PN junction device and the first GaN-based field-effect transistor are integrated on the surface of the same substrate, and due to high electron mobility, high thermal conductivity, high temperature resistance, corrosion resistance, radiation resistance and the like characteristics of the GaN materials, the first GaN-based multi-quantum well optoelectronic PN-junction device and the first GaN-based field-effect transistor in the manufactured monolithic optoelectronic integrated circuit have a high performance; and for the other aspect, the first GaN-based field-effect transistor need not to be manufactured by a complicated ion injection technique in the manufacturing process. The growth of an epitaxial material is not required. And the manufacturing process is compatible with the manufacturing process of the first GaN-based multi-quantum well optoelectronic PN-junction device. In this way, a manufacturing difficulty of the monolithic optoelectronic integrated circuit is effectively lowered.

Described above are preferred examples of the present disclosure. It should be noted that persons of ordinary skill in the art may derive other improvements or polishments without departing from the principles of the present disclosure. Such improvements and polishments shall be deemed as falling within the protection scope of the present disclosure.

What is claimed is:
1. A monolithic optoelectronic integrated circuit, comprising:
a substrate, comprising a photonic integrated device region and a peripheral circuit region;
a first GaN-based multi-quantum well optoelectronic PN-junction device, disposed in the photonic integrated device region on a surface of the substrate, wherein the first GaN-based multi-quantum well optoelectronic PN-junction device acts as a light-emitting diode in the monolithic optoelectronic integrated circuit, and comprises a first P-type ohmic contact electrode and a first N-type ohmic contact electrode;
a first GaN-based field-effect transistor, disposed in the peripheral circuit region on the surface of the substrate, wherein the first GaN-based field-effect transistor comprises a first gate dielectric layer disposed on the surface of the substrate and having a first recess, a first gate filled within the first recess, and a first source and a first drain that are disposed on two opposite sides of the first gate, wherein the first source is electrically connected to the first P-type ohmic contact electrode, the first drain is electrically connected to a first potential, the first N-type ohmic contact electrode is electrically connected to a second potential lower than the first potential, and the first gate is electrically connected to a control port to control the light-emitting diode to be turned on or turned off;

a second GaN-based multi-quantum well optoelectronic PN-junction device, disposed in the photonic integrated device region on a surface of the substrate, wherein the second GaN-based multi-quantum well optoelectronic PN-junction device acts as a photodetector in the monolithic optoelectronic integrated circuit, comprises a second P-type ohmic contact electrode and a second N-type ohmic contact electrode, and is connected to the first GaN-based multi-quantum well optoelectronic PN-junction device by an optical waveguide;

a resistor, disposed in the peripheral circuit region on the surface of the substrate; and a second GaN-based field-effect transistor, disposed in the peripheral circuit region on the surface of the substrate, wherein the second GaN-based field-effect transistor comprises a second gate dielectric layer disposed on the surface of the substrate and having a second recess, a second gate filled in the second recess, and a second source and a second drain that are disposed on two opposite sides of the second gate;

wherein one terminal of the resistor is electrically connected to the second N-type ohmic contact electrode and the other terminal of the resistor is electrically connected to a third potential, the second P-type ohmic contact electrode is electrically connected to a fourth potential lower than the third potential, and a potential between the second N-type ohmic contact electrode and the resistor is electrically connected to the second gate to control the second GaN-based field-effect transistor to be turned on or turned off.

2. The monolithic optoelectronic integrated circuit according to claim 1, wherein the surface of the substrate further comprises an AlGaN buffer layer, and an undoped GaN layer disposed on a surface of the AlGaN buffer layer; and the monolithic optoelectronic integrated circuit further comprises a cavity extending through the AlGaN buffer layer and the undoped GaN layer from the substrate, the optical waveguide is a GaN clamped beam suspended above the cavity, the first GaN-based multi-quantum well optoelectronic PN-junction device and the second GaN-based multi-quantum well optoelectronic PN-junction device are formed on a surface of the undoped GaN layer and suspended above the cavity.

3. The monolithic optoelectronic integrated circuit according to claim 2, wherein the first GaN-based multi-quantum well optoelectronic PN-junction device further comprises a first N-type GaN epitaxial layer, a first InGaN/GaN multi-quantum well layer and a first P-type GaN epitaxial layer that are successively laminated along a direction perpendicular to the substrate, and the second GaN-based multi-quantum well optoelectronic PN-junction device further comprises a second N-type GaN epitaxial layer, a second InGaN/GaN multi-quantum well layer and a second P-type GaN epitaxial layer that are successively laminated along the direction perpendicular to the substrate; and the peripheral circuit region further comprises a third N-type GaN epitaxial layer disposed on the surface of the undoped GaN layer, and the first source, the first drain, the second source and the second drain are all disposed on a surface of the third N-type GaN epitaxial layer;

wherein the third N-type GaN epitaxial layer comprises a first through hole and a second through hole that expose the undoped GaN layer, the first gate dielectric layer covers an inner wall of the first through hole and a portion of the surface of the third N-type GaN epitaxial layer, and the second gate dielectric layer covers an inner wall of the second through hole and a portion of the surface of the third N-type GaN epitaxial layer.

4. The monolithic optoelectronic integrated circuit according to claim 2, further comprising:

an isolation recess extending through the undoped GaN layer and the AlGaN buffer layer and exposing the substrate, wherein the isolation recess isolates the photonic integrated device region from the peripheral circuit region.

5. The monolithic optoelectronic integrated circuit according to claim 1, wherein along a direction parallel to the substrate, the first P-type ohmic contact electrode has a circular cross section, and the first N-type ohmic contact electrode has an arc-shaped cross section and is disposed as surrounding an outer circumference of the first P-type ohmic contact electrode; and along the direction parallel to the substrate, the second P-type ohmic contact electrode has a circular cross section, and the second N-type ohmic contact electrode has an arc-shaped cross section and is disposed as surrounding an outer circumference of the second P-type ohmic contact electrode.

6. The monolithic optoelectronic integrated circuit according to claim 1, wherein the resistor comprises:

two resistive electrodes, disposed on the surface of the substrate; and a resistive arm, disposed on the surface of the substrate, wherein two terminals of the resistive arm are respectively electrically connected to the two resistive electrodes.

7. A method for forming the monolithic optoelectronic integrated circuit, comprising:

providing a substrate, and defining a photonic integrated device region and a peripheral circuit region on a surface of the substrate;

forming a first GaN-based multi-quantum well optoelectronic PN-junction device in the photonic integrated device region on the surface of the substrate, wherein the first GaN-based multi-quantum well optoelectronic PN-junction device acts as a light-emitting diode in the monolithic optoelectronic integrated circuit, and comprises a first P-type ohmic contact electrode and a first N-type ohmic contact electrode;

forming a first GaN-based field-effect transistor in the peripheral circuit region on the surface of the substrate, wherein the first GaN-based field-effect transistor comprises a first gate dielectric layer disposed on the surface of the substrate and having a first recess, a first gate filled in the first recess, and a first source and a first drain that are disposed on two opposite sides of the first gate;

electrically connecting the first source to the first P-type ohmic contact electrode, the first drain to a first potential, the first N-type ohmic contact electrode to a second potential lower than the first potential, and the first gate to a control port to control the light-emitting diode to be turned on or turned off;

forming a second GaN-based multi-quantum well optoelectronic PN-junction device in the photonic integrated device region on the surface of the substrate, wherein the second GaN-based multi-quantum well optoelectronic PN-junction device acts as a photodetector in the monolithic optoelectronic integrated circuit, and comprises a second P-type ohmic contact electrode and a second N-type ohmic contact electrode;

connecting the first GaN-based multi-quantum well optoelectronic PN-junction device to the second GaN-based multi-quantum well optoelectronic PN-junction device by an optical waveguide;

forming a second GaN-based field-effect transistor in the peripheral circuit region on the surface of the substrate, wherein the second GaN-based field-effect transistor comprises a second gate dielectric layer disposed on the surface of the substrate and having a second recess, a second gate filled in the second recess, and a second source and a second drain that are disposed on two opposite sides of the second gate;

forming a resistor in the peripheral circuit region on the surface of the substrate; and electrically connecting one terminal of the resistor to the second N-type ohmic contact electrode and the other terminal of the resistor to a third potential, the second P-type ohmic contact electrode to a fourth potential lower than the third potential, and a potential between the second N-type ohmic contact electrode and the resistor to the second gate to control the second GaN-based field-effect transistor to be turned on or turned off.

\* \* \* \* \*